(12) United States Patent
Kim et al.

(10) Patent No.: US 10,633,486 B2
(45) Date of Patent: Apr. 28, 2020

(54) POLYMER RESIN COMPOUND AND PHOTOSENSITIVE RESIN COMPOSITION FOR BLACK BANK COMPRISING SAME

(71) Applicant: LG CHEM, LTD., Seoul (KR)

(72) Inventors: Taewoo Kim, Daejeon (KR); Won Jung Lee, Daejeon (KR); Youngju Park, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 16/319,022

(22) PCT Filed: Feb. 27, 2018

(86) PCT No.: PCT/KR2018/002372
§ 371 (c)(1),
(2) Date: Jan. 18, 2019

(87) PCT Pub. No.: WO2018/159975
PCT Pub. Date: Sep. 7, 2018

(65) Prior Publication Data
US 2019/0241701 A1    Aug. 8, 2019

(30) Foreign Application Priority Data

Mar. 3, 2017 (KR) .................. 10-2017-0027755

(51) Int. Cl.
| | | |
|---|---|---|
| C08F 2/00 | (2006.01) | |
| C08F 4/00 | (2006.01) | |
| C08G 63/66 | (2006.01) | |
| C08G 63/685 | (2006.01) | |
| G03F 7/032 | (2006.01) | |
| G03F 7/038 | (2006.01) | |
| C08F 283/02 | (2006.01) | |
| C08F 2/50 | (2006.01) | |
| G03F 7/105 | (2006.01) | |
| C08G 65/333 | (2006.01) | |
| G03F 7/00 | (2006.01) | |
| C08F 299/04 | (2006.01) | |
| G03F 7/027 | (2006.01) | |
| C08F 220/26 | (2006.01) | |
| H01L 51/52 | (2006.01) | |

(52) U.S. Cl.
CPC ............... *C08G 63/66* (2013.01); *C08F 2/50* (2013.01); *C08F 220/26* (2013.01); *C08F 283/02* (2013.01); *C08F 299/04* (2013.01); *C08G 63/685* (2013.01); *C08G 65/333* (2013.01); *G03F 7/0007* (2013.01); *G03F 7/027* (2013.01); *G03F 7/032* (2013.01); *G03F 7/038* (2013.01); *G03F 7/0388* (2013.01); *G03F 7/105* (2013.01); *H01L 51/5284* (2013.01)

(58) Field of Classification Search
CPC ..... C08G 63/66; C08G 63/685; C08F 283/02; C08F 2/50; G03F 7/032; G03F 7/105; G03F 7/038; H01L 51/5284
USPC .................................. 526/204, 89, 72; 520/1
See application file for complete search history.

(56) References Cited

U.S. PATENT DOCUMENTS

| | | | |
|---|---|---|---|
| 2010/0029892 A1* | 2/2010 | Heo ...................... | C08G 59/186 528/297 |
| 2010/0085518 A1* | 4/2010 | Choi ..................... | G03F 7/0007 349/110 |
| 2010/0201925 A1 | 8/2010 | Kim et al. | |
| 2010/0331439 A1 | 12/2010 | Heo et al. | |
| 2012/0196949 A1* | 8/2012 | Heo ....................... | C08G 63/21 522/63 |
| 2015/0111009 A1* | 4/2015 | Choi ..................... | G03F 7/032 428/194 |

FOREIGN PATENT DOCUMENTS

| | | |
|---|---|---|
| CN | 106084129 A | 11/2016 |
| JP | 2008-122546 A | 5/2008 |
| JP | 2009-251536 A | 10/2009 |
| KR | 10-2009-0004054 A | 1/2009 |
| KR | 10-2013-0135051 A | 12/2013 |
| KR | 10-2015-0055417 A | 5/2015 |
| KR | 10-2015-0066884 A | 6/2015 |
| KR | 1020150066884 * | 6/2015 |
| KR | 10-2015-0109030 A | 10/2015 |
| KR | 10-2017-0015904 A | 2/2017 |
| WO | 2007-123017 A1 | 11/2007 |
| WO | 2008069298 A1 | 6/2008 |
| WO | 2008-102953 A1 | 8/2008 |
| WO | 2009-048231 A2 | 4/2009 |
| WO | 2010-041810 A1 | 4/2010 |

OTHER PUBLICATIONS

Won et al, KR 1020150066884 Machine Translation, Jun. 17, 2015 (Year: 2015).*
International Search Report issued for PCT/KR2018/002372 dated Jun. 21, 2018, 5 pages.

* cited by examiner

*Primary Examiner* — Jessica Whiteley
(74) *Attorney, Agent, or Firm* — Rothwell, Figg, Ernst & Manbeck, P.C.

(57) ABSTRACT

A polymer resin compound, a photosensitive resin composition for a black bank comprising the polymer resin compound, and a method for manufacturing a black bank. The method comprises coating the photosensitive resin composition on a substrate to form a photosensitive resin film; exposing and developing the photosensitive resin film to pattern the coated photosensitive resin film; and curing the patterned photosensitive resin film.

17 Claims, 4 Drawing Sheets

| DEVELOPMENT TIME | hole shape | taper angle and pattern thickness(10μm) | 10μm hole pattern (unit: μm) | 15μm hole pattern (unit: μm) |
|---|---|---|---|---|
| 90s | | 48.81° | | |
| 100s | | 36.05° | | |
| 110s | | 48.85° | | |

[FIG. 4]

| DEVELOPMENT TIME | hole shape | taper angle and pattern thickness(10μm) | 10μm hole pattern (unit: μm) | 15μm hole pattern (unit: μm) |
|---|---|---|---|---|
| 90s | | 17.41° | | |
| 100s | | 19.56° | | |
| 110s | | 50.50° | | |

[FIG. 5]
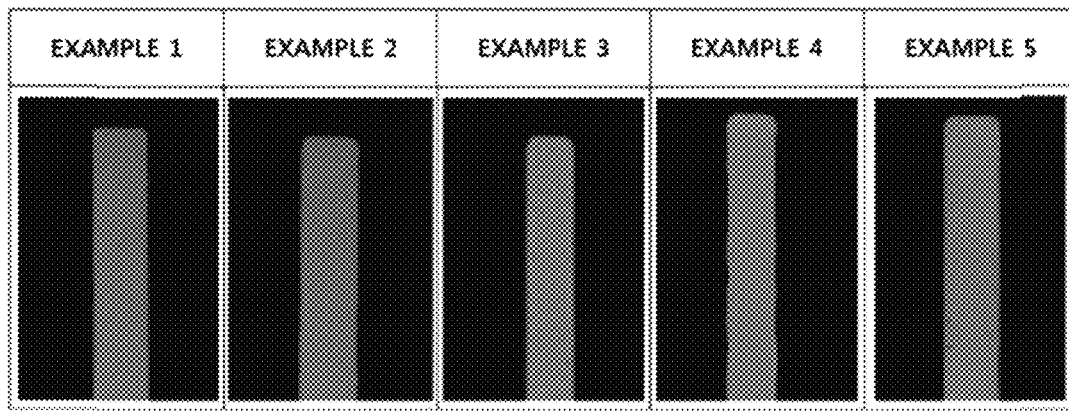
[FIG. 6]

[FIG. 7]
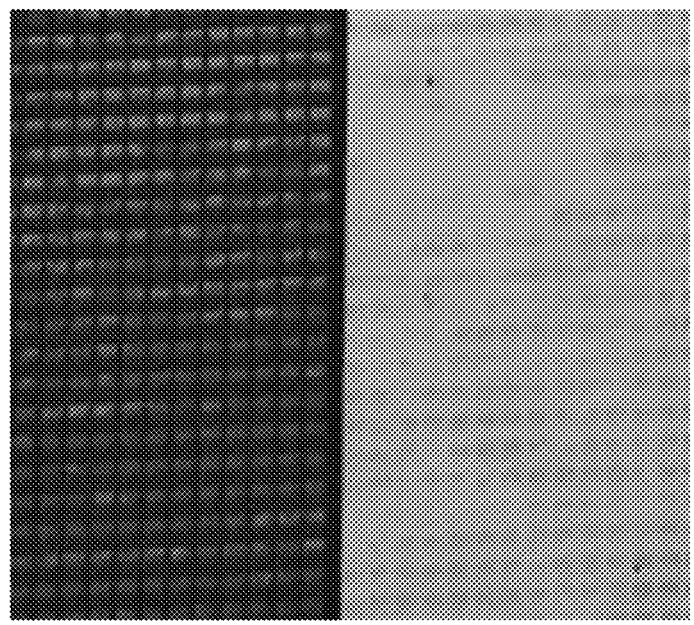

POLYMER RESIN COMPOUND AND PHOTOSENSITIVE RESIN COMPOSITION FOR BLACK BANK COMPRISING SAME

FIELD OF THE INVENTION

The application is a 35 U.S.C. § 371 National Phase Entry Application from PCT/KR2018/002372, filed on Feb. 27, 2018, and designating the United States, which claims priority to and the benefits of Korean Patent Application No. 10-2017-0027755, filed with the Korean Intellectual Property Office on Mar. 3, 2017, the entire contents of which are incorporated herein by reference.

The present specification relates to a polymer resin compound and a photosensitive resin composition for a black bank comprising the same.

BACKGROUND OF THE INVENTION

An OLED is a self-emissive display device, and has received attention as a next generation display device with an advantage of not requiring a backlight for light emission, having a wide viewing angle, and having a high response speed as well. A constitution of a luminant part of such an OLED device generally comprises a transparent substrate, a transparent electrode layer, an organic light emitting layer, a metal electrode layer and, as necessary, an insulator film and a partition wall.

As the insulator film, inorganic materials such as silicon oxide or silicon nitride, or organic materials such as polyimide have been used in the art, and when forming the insulator film using common inorganic or organic materials, production costs increase since a multi-step process performing coating a photoresist (hereinafter, referred to as "PR") on a substrate, exposure, PR development, etching and PR removing is generally required. In order to resolve such a problem, photosensitive polymers such as photosensitive polyimide, and the like, have been used as the insulator film (transparent bank). However, such an insulator film is transparent and thereby does not have a light-shielding property, and therefore, has a problem of reducing visibility by external light reflection of a metal electrode. Particularly, relative luminance and a contrast ratio rapidly decrease in the outdoors exposed to sunlight due to external light reflection.

In order to resolve such a problem of contrast ratio decrease, most existing OLEDs use a polarizing film on the surface of a substrate to reduce a contrast decrease caused by external light reflection. However, using a polarizing film blocks some of the light produced in an organic light emitting layer, and therefore, a luminance decrease may not be prevented.

When using a black bank in an insulator film of an OLED, a light-shielding property that has not been present in existing polyimide insulator films may be obtained, and external light reflection may be reduced, and there is no concern over a luminance decrease as well as costs are reduced since it is not required to use a polarizing film.

Particularly, a technology of obtaining a hole pattern using a narrow slit mask is important in developing a black bank for mobiles, and the hole pattern becomes an active area as an anode in an OLED structure. A device lifetime is reduced when residues are present in such a hole pattern and visibility becomes poor when straightness is not favorable. Using an existing Cardo-based binder has a problem of reducing straightness and causing residues in the hole.

Accordingly, research and development on a photosensitive resin composition for a black bank having improved hole residues and straightness have been continuously required in the art.

SUMMARY OF THE INVENTION

The present specification is directed to providing a polymer resin compound and a photosensitive resin composition for a black bank comprising the same.

One embodiment of the present specification provides a polymer resin compound comprising a repeating unit of the following Chemical Formula 1.

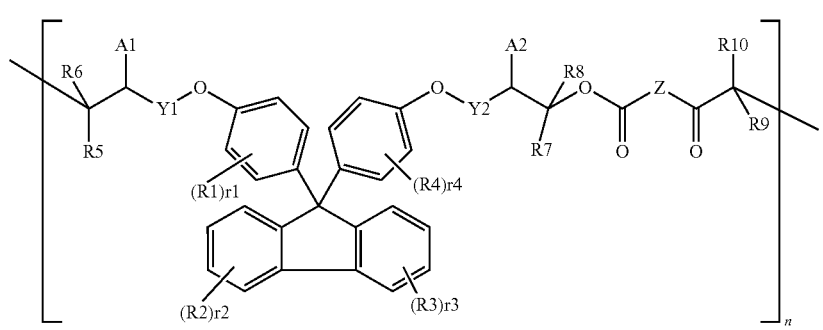

[Chemical Formula 1]

In Chemical Formula 1,

A1 and A2 are the same as or different from each other, and each independently a substituted or unsubstituted carbamate group; or a hydroxyl group, when any one of A1 and A2 is a hydroxyl group, the rest is a substituted or unsubstituted carbamate group, Y1 and Y2 are the same as or different from each other, and each independently a substituted or unsubstituted alkylene group having 1 to 3 carbon atoms; a substituted or unsubstituted ethylene oxide group; or a substituted or unsubstituted propylene oxide group, Z is a substituted or unsubstituted divalent alkyl group; substituted or unsubstituted divalent cyclohexane; substituted or unsubstituted divalent cyclohexyne; or substituted or unsubstituted divalent benzene, R1 to R10 are the same as or different from each other, and each independently hydrogen; deuterium; a halogen group; a substituted or unsubstituted alkyl group having 1 to 10 carbon atoms; a substituted or unsubstituted cycloalkyl group having 3 to 10 carbon atoms; a substituted or unsubstituted silyl group; a substituted or unsubstituted phosphine oxide group; a substituted or unsubstituted aryl group; or a substituted or unsubstituted heterocyclic group, r1 to r4 are each independently an integer of 1 to 4, when r1 to r4 are each 2 or greater, structures in the parentheses are each the same as or different from each other, n is from 2 to 5,000, and when n is 2 or greater, structures in the parentheses are the same as or different from each other.

Another embodiment of the present specification provides a photosensitive resin composition for a black bank comprising the polymer resin compound, a monomer, a photoinitiator, a coloring agent and a solvent.

Still another embodiment of the present specification provides a black bank manufactured using the photosensitive resin composition for a black bank.

Yet another embodiment of the present specification provides a method for manufacturing a black bank comprising Step 1) coating the photosensitive resin composition for a black bank on a substrate to form a photosensitive resin film; Step 2) exposing and developing the coated photosensitive resin film to pattern the coated photosensitive resin film; and Step 3) curing the patterned photosensitive resin film.

BRIEF DESCRIPTION OF THE DRAWINGS

FIG. 1 shows straightness and development margin properties of Experimental Example 1 of the present specification;

FIG. 2 shows straightness and development margin properties of Experimental Example 2 of the present specification;

FIG. 3 shows straightness and development margin properties of Experimental Example 3 of the present specification;

FIG. 4 shows straightness and development margin properties of Experimental Example 4 of the present specification;

FIG. 5 shows straightness and development margin properties of Experimental Example 5 of the present specification;

FIG. 6 shows results of evaluating residues of Experimental Examples 1 to 5 of the present specification; and FIG. 7 shows results of evaluating torn out of Experimental Example 6 of the present specification.

DETAILED DESCRIPTION OF THE EMBODIMENTS

Hereinafter, the present specification will be described in more detail.

The present specification provides a polymer resin compound represented by Chemical Formula 1.

The polymer resin compound of Chemical Formula 1 has properties of excellent developability, adhesion and photosensitive resin composition stability by a fluorene structure of the core structure, and by introducing a carbamate substituent to A1 and A2 positions, has excellent straightness and is effective in improving hole residues compared to when the substituent is not introduced.

Examples of substituents in the present specification are described below, however, the substituents are not limited thereto.

In the present specification,

means a linked site.

The term "substitution" in the present specification means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one, two or more substituents selected from the group consisting of deuterium; a halogen group; a nitrile group; a nitro group; an alkyl group; a cycloalkyl group; an amine group; an arylamine group; a silyl group; a phosphine oxide group; an aryl group; and a heteroaryl group including one or more of N, O, S, Se and Si atoms, or being substituted with a substituent linking two or more substituents among the substituents illustrated above, or having no substituents.

In the present specification, examples of the halogen group may include fluorine, chlorine, bromine or iodine.

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl and the like, but are not limited thereto.

In the present specification, the cycloalkyl group is not particularly limited, but preferably has 3 to 60 carbon atoms, and specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the silyl group is a substituent including Si and having the Si atom directly linked as a radical, and is represented by $-SiR_{201}R_{202}R_{203}$. $R_{201}$ to $R_{203}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

When the aryl group is a monocyclic aryl group in the present specification, the number of carbon atoms is not particularly limited, but is preferably from 6 to 30. Specific examples of the monocyclic aryl group may include a phenyl group, a biphenyl group, a terphenyl group, a quaterphenyl group and the like, but are not limited thereto.

When the aryl group is a multicyclic aryl group, the number of carbon atoms is not particularly limited, but is preferably from 6 to 50. Specific examples of the multicyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

When the fluorenyl group is substituted,

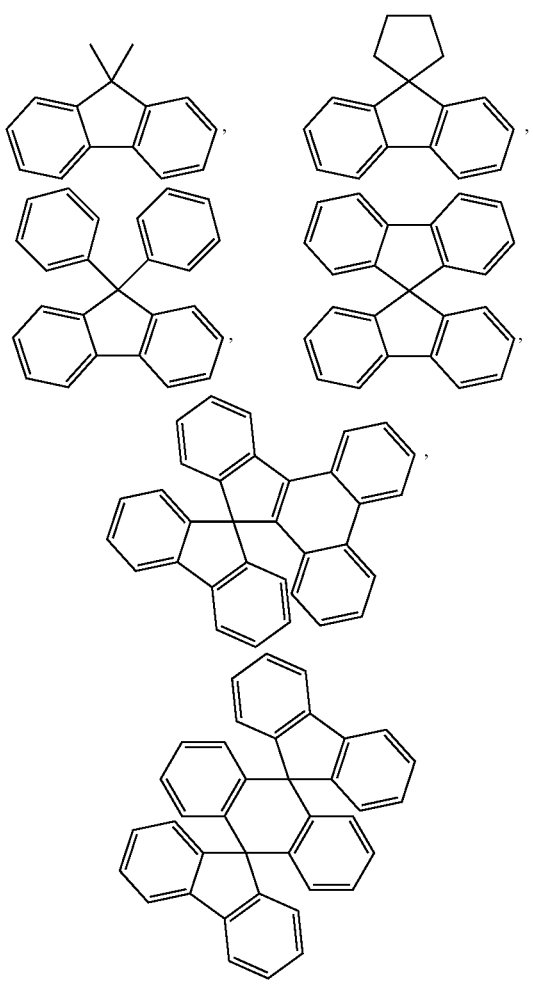

and the like may be included. However, the structure is not limited thereto.

In the present specification, the heteroaryl group is a heterocyclic group including one or more of N, O, S, Si and Se as a heteroatom, and although not particularly limited thereto, the number of carbon atoms is preferably from 2 to 60. Examples of the heteroaryl group may include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a dibenzofuranyl group and the like, but are not limited thereto.

In the present specification, specific examples of the phosphine oxide group may include a diphenylphosphine oxide group, a dinaphthylphosphine oxide group and the like, but are not limited thereto.

In the present specification, the alkylene group means the alkyl group having two bonding sites, that is, a divalent group. Descriptions on the alkyl group provided above may be applied thereto except for each being a divalent.

In one embodiment of the present specification, A1 and A2 are the same as or different from each other, and each independently a substituted or unsubstituted carbamate group or a hydroxyl group.

In one embodiment of the present specification, when any one of A1 and A2 is a hydroxyl group, the rest is a substituted or unsubstituted carbamate group.

In one embodiment of the present specification, A1 is a substituted or unsubstituted carbamate group, and A2 is a hydroxyl group.

In one embodiment of the present specification, A1 is a hydroxyl group, and A2 is a substituted or unsubstituted carbamate group.

In one embodiment of the present specification, A1 and A2 are a substituted or unsubstituted carbamate group.

In one embodiment of the present specification, Y1 and Y2 are the same as or different from each other, and each independently a substituted or unsubstituted alkylene group having 1 to 3 carbon atoms; a substituted or unsubstituted ethylene oxide group; or a substituted or unsubstituted propylene oxide group.

In one embodiment of the present specification, Y1 and Y2 are the same as or different from each other, and each independently a substituted or unsubstituted methylene group, a substituted or unsubstituted ethylene group, or a substituted or unsubstituted propylene group.

In one embodiment of the present specification, Y1 and Y2 are a methylene group.

In one embodiment of the present specification, Y1 and Y2 are an ethylene group.

In one embodiment of the present specification, Y1 and Y2 are a propylene group.

In one embodiment of the present specification, Z is a substituted or unsubstituted divalent alkyl group; substituted or unsubstituted divalent cyclohexane; substituted or unsubstituted divalent cyclohexyne; or substituted or unsubstituted divalent benzene.

In one embodiment of the present specification, Z is substituted or unsubstituted cyclohexyne.

In one embodiment of the present specification, Z is cyclohexyne.

In one embodiment of the present specification, R1 to R10 are the same as or different from each other, and each independently hydrogen; deuterium; a halogen group; a substituted or unsubstituted alkyl group having 1 to 10 carbon atoms; a substituted or unsubstituted cycloalkyl group having 3 to 10 carbon atoms; a substituted or unsubstituted silyl group; a substituted or unsubstituted phosphine oxide group; a substituted or unsubstituted aryl group; or a substituted or unsubstituted heterocyclic group.

In one embodiment of the present specification, R1 to R10 are hydrogen.

In one embodiment of the present specification, the carbamate group may be represented by the following Chemical Formula 2.

[Chemical Formula 2]

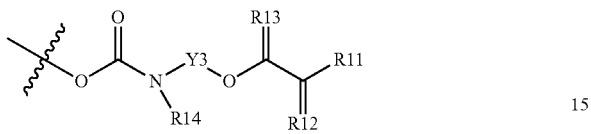

In Chemical Formula 2,

Y3 is a substituted or unsubstituted alkylene group having 1 to 3 carbon atoms; a substituted or unsubstituted ethylene oxide group; or a substituted or unsubstituted propylene oxide group, R11 and R14 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, R12 and R13 are the same as or different from each other, and each independently O; S; NR101; or CR102R103, and R101 to R103 are the same as or different from each other, and each independently hydrogen; deuterium; a substituted or unsubstituted alkyl group; a substituted or unsubstituted cycloalkyl group; a substituted or unsubstituted aryl group; or a substituted or unsubstituted heterocyclic group.

In one embodiment of the present specification, Chemical Formula 1 may be represented by the following Chemical Formula 3.

[Chemical Formula 3]

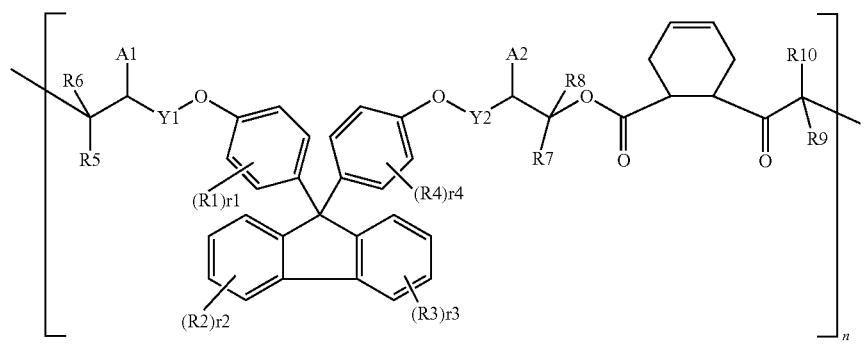

In Chemical Formula 3,

A1, A2, Y1, Y2, R1 to R10, r1 to r4 and n have the same definitions as in Chemical Formula 1.

In one embodiment of the present specification, Chemical Formula 1 may be represented by any one of the following Chemical Formulae 4 to 6.

[Chemical Formula 4]

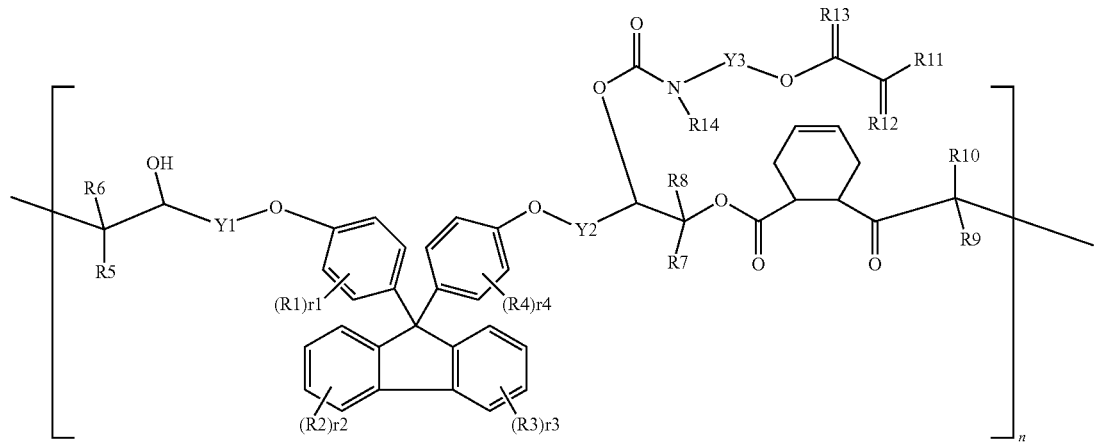

[Chemical Formula 5]

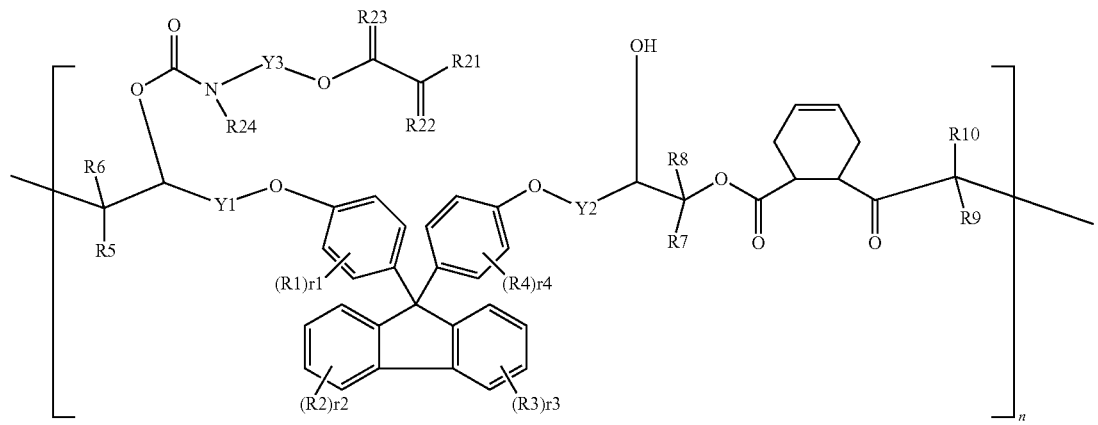

[Chemical Formula 6]

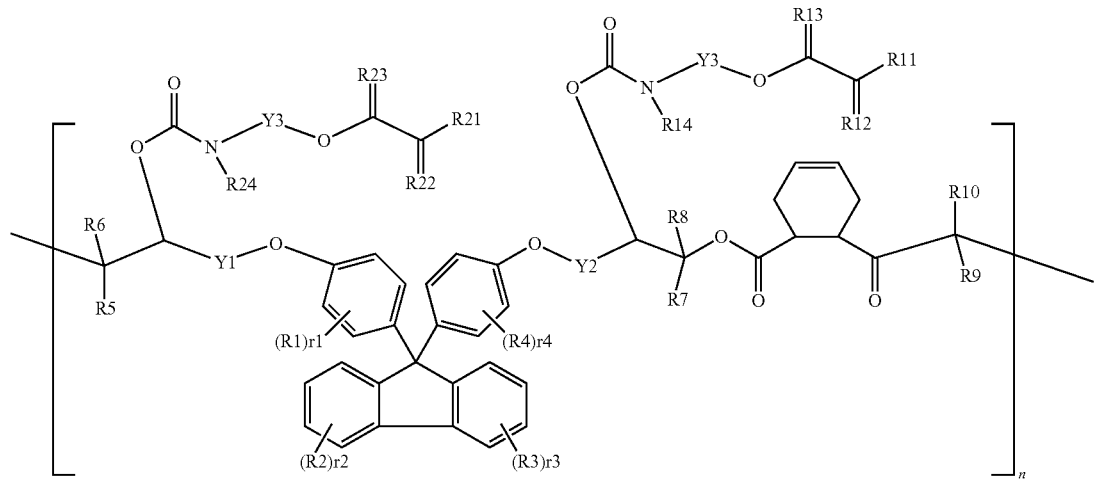

In Chemical Formulae 4 to 6,

Y1, Y2, R1 to R10 and r1 to r4 and n have the same definitions as in Chemical Formula 1, Y3 is a substituted or unsubstituted alkylene group having 1 to 3 carbon atoms; a substituted or unsubstituted ethylene oxide group; or a substituted or unsubstituted propylene oxide group, R11, R14, R21 and R24 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, R12, R13, R22 and R23 are the same as or different from each other, and each independently O; S; NR101; or CR102R103, and R101 to R103 are the same as or different from each other, and each independently hydrogen; deuterium; a substituted or unsubstituted alkyl group; a substituted or unsubstituted cycloalkyl group; a substituted or unsubstituted aryl group; or a substituted or unsubstituted heterocyclic group.

In one embodiment of the present specification, Y3s are the same as or different from each other, and each independently a substituted or unsubstituted methylene group, a substituted or unsubstituted ethylene group, or a substituted or unsubstituted propylene group.

In one embodiment of the present specification, Y3 is a methylene group.

In one embodiment of the present specification, Y3 is an ethylene group.

In one embodiment of the present specification, Y3 is a propylene group.

In one embodiment of the present specification, R11 or R14 is hydrogen.

In one embodiment of the present specification, R12 or R13 is O.

In one embodiment of the present specification, R12 or R13 is S.

In one embodiment of the present specification, R12 or R13 is NR101.

In one embodiment of the present specification, R12 or R13 is CR102R103.

In one embodiment of the present specification, R101 to R103 are hydrogen.

In one embodiment of the present specification, Chemical Formula 1 is any one selected from among the following structures.

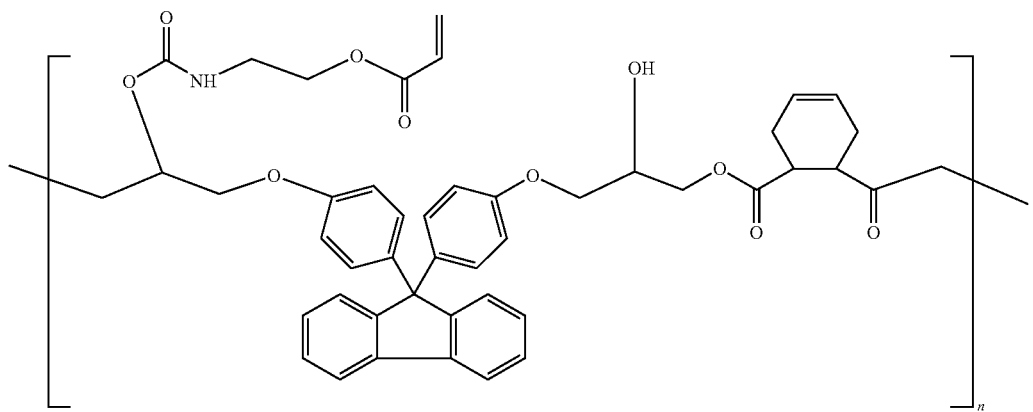

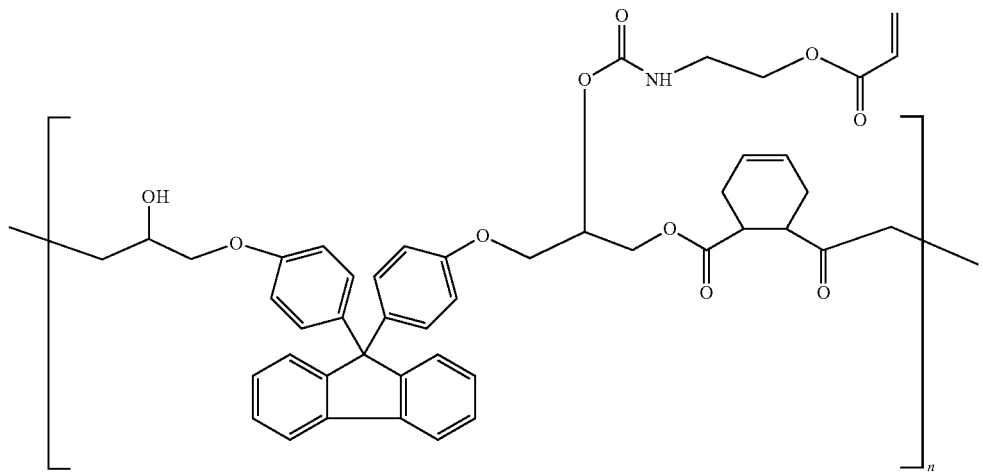

-continued

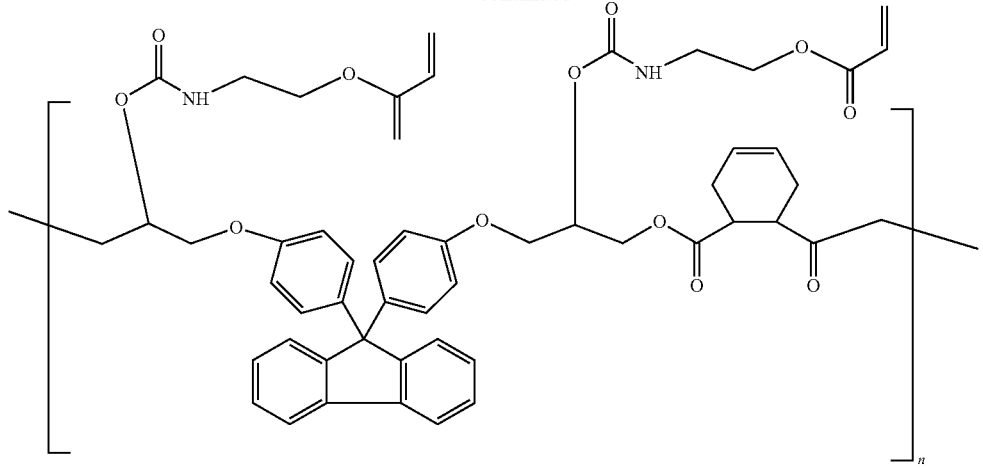

In one embodiment of the present specification, the polymer resin compound has a weight average molecular weight of 1,000 to 50,000. The weight average molecular weight is preferably from 1,000 to 10,000 and more preferably from 1,000 to 5,000.

The photosensitive resin composition has a different developing rate depending on the average molecular weight of the polymer resin compound. When the molecular weight is less than 1,000, the developing rate increases and a stable pattern may not be obtained, and when the molecular weight is greater than 50,000, the developing rate is low and viscosity of the solution excessively increases leading to a disadvantage of uniform coating being difficult.

The present specification provides a photosensitive resin composition for a black bank comprising the polymer resin compound, a monomer, a photoinitiator, a coloring agent and a solvent.

In one embodiment of the present specification, the content of the polymer resin compound is from 1% by weight to 20% by weight based on the total weight of the photosensitive resin composition for a black bank.

In one embodiment of the present specification, the monomer comprises one or more types selected from the group consisting of monofunctional monomers such as polyethylene glycol mono(meth)acrylate, polypropylene glycol mono(meth)acrylate or phenoxyethyl (meth)acrylate and multifunctional monomers such as polyethylene glycol (meth)acrylate, polypropylene glycol (meth)acrylate, trimethylolethane triacrylate, trimethylolpropane triacrylate, neopentyl glycol (meth)acrylate, pentaerythritol hexaacrylate or dipentaerythritol hexaacrylate (DPHA), but is not limited thereto.

The multifunctional monomer has increased crosslink density compared to the monofunctional monomer when exposed, and has an advantage in that a pattern is more readily obtained. In the black bank of the present specification, the multifunctional monomer is more suited compared to the monofunctional monomer for enhancing curability that decreases due to a light-shielding property, however, the monomer is not limited thereto.

In one embodiment of the present specification, the multifunctional monomer is dipentaerythritol hexaacrylate (DPHA) or the dipentaerythritol hexaacrylate (DPHA) and dipentaerythritol hexaacrylate (DPHA)-4OH.

In one embodiment of the present specification, the content of the monomer is from 1% by weight to 10% by weight based on the total weight of the photosensitive resin composition for a black bank. When the monomer content is outside the above-mentioned range, developability becomes worse making pattern obtaining difficult.

In one embodiment of the present specification, the photoinitiator comprises one or more types selected from the group consisting of acetophenone-based compounds, biimidazole-based compounds, triazine-based compounds and oxime-based compounds, but is not limited thereto.

In one embodiment of the present specification, the content of the photoinitiator is from 0.1% by weight to 5% by weight based on the total weight of the photosensitive resin composition for a black bank. When the content is in the above-mentioned range, a development margin is excellent when obtaining a pattern, and the range of fluctuation in the hole size (critical dimension, CD) is not wide.

In one embodiment of the present specification, the coloring agent may comprises various inorganic pigments or organic pigments such as lactam-based black, aniline black, anthraquinone-based black pigments, perylene-based black pigments or azomethine-based black pigments, but is not limited thereto, and mixtures of organic pigments such as red pigments, blue pigments and green pigments and/or inorganic pigments may also be used.

Preferred specific examples of the organic pigment may include 2-hydroxy-4-n-octoxybenzophenone, methyl-2-cyanoacrylate, 2,4-bis[2-hydroxy-4-butoxyphenyl]-6-(2,4-dibutoxyphenyl)-1,3,5-triazine, C. I. Pigment Black 1,6,7, 12,20,31, C.I. Pigment Blue 15:6, Pigment Red 254, Pigment Green 36, Pigment Yellow 150 and the like, and one type may be used alone, or two or more types may be combined.

In one embodiment of the present specification, the content of the coloring agent is from 5% by weight to 15% by weight based on the total weight of the photosensitive resin composition for a black bank. When the content of the coloring agent is less than 5% by weight, sufficient optical density is not secured, and when the content is greater than 15% by weight, pattern processability is reduced even though optical density is readily secured.

In one embodiment of the present specification, the solvent may include alkylene glycol alkyl ethers, alkylene glycol alkyl ether acetates, alcohols, solvent naphthas and the like. Among these, one or more types of solvents selected from the group consisting of alkylene glycol alkyl ethers, alkylene glycol alkyl ether acetates and alcohols are preferred, and at least one type of solvent selected from the group consisting of propylene glycol monomethyl ether acetate, propylene glycol monomethyl ether, diethylene glycol ethyl methyl ether, diethylene glycol methyl butyl ether, triethylene glycol methyl butyl ether, methyl 3-methoxypropionate, ethyl 3-ethoxypropionate, diethylene glycol monoethyl ether acetate, 3-methoxybutyl acetate and 2-propanol is more preferred.

Specifically, one or more types of solvents selected from the group consisting of methyl-3-methoxypropionate (144° C.), ethylene glycol methyl ether (125° C.), ethylene glycol ethyl ether (135° C.), ethylene glycol diethyl ether (121° C.), dibutyl ether (140° C.), ethyl pyruvate (144° C.), propylene glycol methyl ether (121° C.), propylene glycol methyl ether acetate (146° C.), n-butyl acetate (125° C.), isobutyl acetate (116° C.), amyl acetate (149° C.), isoamyl acetate (143° C.), butyl propionate (146° C.), isoamyl propionate (156° C.), ethyl butyrate (120° C.), propyl butyrate (143° C.), methyl-3-methoxyisobutyrate (148° C.), methyl glycolate (150° C.), methyl lactate (145° C.), ethyl lactate (154° C.), methyl-2-hydroxyisobutyrate (137° C.), ethyl ethoxyacetate (156° C.), 2-methoxyethyl acetate (145° C.), ethylene glycol methyl ether acetate (145° C.), 2-ethoxyethyl acetate (156° C.), dibutyl ether (140° C.), cyclopentanone (131° C.), cyclohexanone (155° C.), 2-hexanone (127° C.), 3-hexanone (123° C.), 5-methyl-2-hexanone (145° C.), 2-heptanone (150° C.), 3-heptanone (148° C.), 4-heptanone (145° C.), 2-methyl-3-heptanone (159° C.), 1-methoxy-2-propanol (118° C.), ethyl-2-hydroxy-propionate (154° C.), ethyl-3-methoxypropionate (158° C.), 2-methoxyethyl ether (162° C.), 3-methoxybutyl acetate (170° C.), 2-ethoxyethyl ether (185° C.), 2-butoxyethanol (171° C.), 3-ethoxy-propanol (161° C.), diethylene glycol dodecyl ether (169° C.), dipropylene glycol methyl ether (188° C.), 2,6-dimethyl-4-heptanone (169° C.), 2-octanone (173° C.), 3-octanone (168° C.), 3-nonanone (188° C.), 5-nonanone (187° C.), 4-hydroxy-4-methyl-2-pentanone (166° C.), 2-methylcyclohexanone (163° C.), 3-methylcyclohexanone (170° C.), 4-methylcyclohexanone (170° C.), 2,6-dimethylcyclohexanone (175° C.), 2,2,6-trimethylcyclohexanone (179° C.), cycloheptanone (179° C.), hexyl acetate (169° C.), amyl butyrate(185° C.), isopropyl lactate (167° C.), butyl lactate (186° C.), ethyl-3-hydroxybutyrate (170° C.), ethyl-3-ethoxypropionate (170° C.), ethyl-3-hydroxybutyrate (180° C.), propyl-2-hydroxy-propionate (169° C.), propylene glycol diacetate (186° C.), propylene glycol butyl ether (170° C.), propylene glycol methyl ether propionate (160° C.), diethylene glycol dimethyl ether (162° C.), diethylene glycol dimethyl ether acetate (165° C.), dipropylene glycol methyl ether (188° C.), dipropylene glycol dimethyl ether (171° C.), ethylene glycol butyl ether (171° C.), diethylene glycol methyl ethyl ether (176° C.), diethylene glycol methyl isopropyl ether (179° C.), ethylene glycol diethyl ether (189° C.), butyl butyrate (165° C.), ethyl-3-ethoxypropionate (170° C.), diethylene glycol monomethyl ether (194° C.), 4-ethylcyclohexanone (193° C.), 2-butoxyethyl acetate (192° C.), diethylene glycol monoethyl ether (202° C.), butyrolactone (204° C.), hexyl butyrate (205° C.), diethylene glycol methyl ether acetate (209° C.), diethylene glycol butyl methyl ether (212° C.), tripropyl glycol dimethyl ether (215° C.), triethylene glycol dimethyl ether (216° C.), ethylene glycol ethyl ether acetate (217° C.), diethylene glycol butyl ether acetate (245° C.), 3-epoxy-1,2-propanediol (222° C.), ethyl-4-acetyl butyrate (222° C.), diethylene glycol monobutyl ether (231° C.), tripropyl glycol methyl ether (242° C.), diethylene glycol (245° C.), 2-(2-butoxyethoxy)ethyl acetate (245° C.), catechol (245° C.), triethylene glycol methyl ether (249° C.), diethylene glycol dibutyl ether (256° C.), triethylene glycol ethyl ether (256° C.), diethylene glycol monohexyl ether (260° C.), triethylene glycol butyl methyl ether (261° C.), triethylene glycol butyl ether (271° C.), tripropyl glycol (273° C.) and tetraethylene glycol dimethyl ether (276° C.) are preferred, however, the solvent is not limited thereto.

In one embodiment of the present specification, the content of the solvent is from 60% by weight to 90% by weight based on the total weight of the photosensitive resin composition for a black bank.

In one embodiment of the present specification, the photosensitive resin composition for a black bank may further comprises one or more types of additives selected from the group consisting of a photocrosslinking sensitizer, a curing accelerator, an adhesion promoter, an adhesive strength enhancer, a surfactant, an antioxidant, a thermal polymerization inhibitor, an ultraviolet absorber, a dispersant and a leveling agent.

As the photocrosslinking sensitizer, one or more types selected from the group consisting of benzophenone-based compounds such as benzophenone, 4,4-bis(dimethylamino) benzophenone, 4,4-bis(diethylamino)benzophenone, 2,4,6-tri methylaminobenzophenone, methyl-o-benzoyl benzoate, 3,3-dimethyl-4-methoxybenzophenone or 3,3,4,4-tetra(t-butylperoxycarbonyl)benzophenone; fluorenone-based compounds such as 9-fluorenone, 2-chloro-9-fluorenone or 2-methyl-9-fluorenone; thioxanthone-based compounds such as thioxanthone, 2,4-diethyl thioxanthone, 2-chlorothioxanthone, 1-chloro-4-propyloxy thioxanthone, isopropyl thioxanthone or diisopropyl thioxanthone; xanthone-based compounds such as xanthone or 2-methylxanthone; anthraquinone-based compounds such as anthraquinone, 2-methyl anthraquinone, 2-ethyl anthraquinone, t-butyl anthraquinone or 2,6-dichloro-9,10-anthraquinone; acridine-based compounds such as 9-phenylacridine, 1,7-bis(9-acridinyl)heptane, 1,5-bis(9-acridinylpentane) or 1,3-bis(9-acridinyl)propane; dicarbonyl compounds such as benzyl, 1,7,7-trimethyl-bicyclo[2,2,1]heptane-2,3-dione or 9,10-phenanthrenequinone; phosphine oxide-based compounds such as 2,4,6-trimethylbenzoyl diphenylphosphine oxide or bis(2,6-dimethoxybenzoyl)-2,4,4-trimethylpentyl phosphine oxide; benzoate-based compounds such as methyl-4-(dimethylamino)benzoate, ethyl-4-(dimethylamino)benzoate or 2-n-butoxyethyl-4-(dimethylamino)benzoate; amino synergists such as 2,5-bis(4-diethylaminobenzal)cyclopentanone, 2,6-bis(4-diethylaminobenzal)cyclohexanone or 2,6-bis(4-diethylaminobenzal)-4-methyl-cyclopentanone; coumarin-based compounds such as 3,3-carbonylvinyl-7-(diethylamino)coumarin, 3-(2-benzothiazolyl)-7-(diethylamino) coumarin, 3-benzoyl-7-(diethylamino) coumarin, 3-benzoyl-7-methoxy-coumarin or 10,10-carbonylbis[1,1,7,7-tetramethyl-2,3,6,7-tetrahydro-1H,5H,11H—C1]-benzopyrano[6,7,8-ij]-quinolizin-11-one; chalcone-based compounds such as 4-diethylaminochalcone or 4-azidebenzalacetophenone; 2-benzoylmethylene and 3-methyl-b-naphthothiazoline.

As the curing accelerator, one or more types selected from the group consisting of 2-mercaptobenzimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate) and trimethylolpropane-tris(3-mercaptopropionate).

As the adhesion promoter, one or more types selected from the group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane.

As the adhesive strength enhancer, one or more types selected from the group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane. In addition, adhesive strength enhancers known in the art may also be used without being limited thereto.

As the antioxidant, 2,2-thiobis(4-methyl-6-t-butylphenol), 2,6-g,t-butylphenol or the like may be used, and as the ultraviolet absorber, 2-(3-t-butyl-5-methyl-2-hydroxyphenyl)-5-chloro-benzotriazole, alkoxybenzophenone or the like may be used.

Examples of the thermal polymerization inhibitor may comprises one or more types selected from the group consisting of p-anisole, hydroquinone, pyrocatechol, t-butyl catechol, N-nitrosophenylhydroxyamine ammonium salt, N-nitrosophenylhydroxyamine aluminum salt and phenothiazine, but are not limited thereto, and may include those generally known in the art.

As the ultraviolet absorber, the dispersant and the leveling agent, those generally used in the art may all be used.

In addition thereto, the photosensitive resin composition may further comprises one or more types of secondary additives selected from the group consisting of carbon black dispersions, resin binders having functionality, multifunctional monomers, radiation-sensitive compounds and other additives.

The present specification provides a black bank manufactured using the photosensitive resin composition for a black bank.

The present specification provides a method for manufacturing a black bank comprising Step 1) coating the photosensitive resin composition for a black bank on a substrate to form a photosensitive resin film; Step 2) exposing and developing the coated photosensitive resin film to pattern the coated photosensitive resin film; and Step 3) curing the patterned photosensitive resin film.

In one embodiment of the present specification, a developer used for developing the coated photosensitive resin composition for a black bank is an aqueous tetramethylammonium hydroxide (TMAH) solution.

Unlike a photosensitive resin composition developable in a KOH developer in the development of a black bank in the art, the photosensitive resin composition for a black bank according to one embodiment of the present specification obtains a pattern in a tetramethylammonium hydroxide (TMAH) developer used in a TFT line, and burden of costs required for adding a KOH developing line may be reduced since an existing developing system may be used as it is in an actual display panel manufacturing line.

In the method for manufacturing a black bank according to the present specification, the step 1) is a step of coating the photosensitive resin composition for a black bank, and for example, methods known in the art may be used for the coating on a substrate. More specifically, the method of coating the photosensitive resin composition may include a spray method, a roll coating method, a spin coating method, a bar coating method, a slit coating method and the like, but is not limited thereto.

Herein, as the substrate, metals, papers, glass, plastic, silicon, polycarbonate, polyester, aromatic polyamide, polyamideimide, polyimide and the like may be used, and for these substrates, proper pretreatment such as chemical treatment by a silane coupling agent, plasma treatment, ion plating, sputtering, a gas phase reaction method or vacuum deposition may be performed depending on the purpose.

In addition, a thin film transistor for driving may be selectively placed on the substrate, and a mixture of indium and tin oxide (ITO) may be sputtered.

In the method for manufacturing a black bank according to the present specification, the step 2) is a step of exposing and developing the coated photosensitive resin composition for a black bank.

More specifically, a pattern may be formed by irradiating ultraviolet rays on the prebaked coated film through a predetermined pattern mask, and developing the film using an aqueous alkali solution to remove unnecessary parts. Herein, a dipping method, a shower method, a puddle method and the like may be used without limit as the developing method. The developing time is from 30 seconds to 180 seconds. As the developer as an aqueous alkali solution, inorganic alkalis such as sodium hydroxide, potassium hydroxide, sodium silicate, sodium metasilicate or ammonia; primary amines such as ethylamine or N-propylamine; secondary amines such as diethylamine or di-n-propylamine; tertiary amines such as trimethylamine, methyldiethylamine or dimethylethylamine; tertiary alcohol amines such as dimethylethanolamine, methyldiethanolamine or triethanolamine; cyclic tertiary amines such as pyrrole, piperidine, n-methyl piperidine, n-methyl pyrrolidine, 1,8-diazabicyclo[5.4.0]-7-undecene, 1,5-diazabicyclo[4.3.0]-5-nonene; aromatic tertiary amines such as pyridine, collidine, lutidine or quinoline; an aqueous solution of quaternary ammonium salt such as tetramethylammonium hydroxide or tetraethylammonium hydroxide, and the like may be used.

After the development, the result is water washed for approximately 10 seconds to 50 seconds, and dried using air or nitrogen to form a pattern. Through post-baking this pattern using a heating device such as a hot plate or an oven, a complete photosensitive material pattern may be obtained. Herein, as a condition of the post-bake, heating for approximately 10 minutes to 90 minutes at 150° C. to 230° C. is preferred.

Examples of a light source for curing the photosensitive resin composition of the present specification may include mercury vapor arc, carbon arc or Xe arc emitting light with a wavelength of 250 nm to 450 nm, but are not limited thereto.

The black bank according to the present specification has an advantage in that proper developability for a tetramethylammonium hydroxide (TMAH) developer, a light-shielding property and hole formation are readily obtained.

Hereinafter, the present disclosure will be described in more detail with reference to examples, however, the following examples are for illustrating the present specification only, and the scope of the present specification is not limited thereto.

EXAMPLE

Structures of binders and syntheses methods used in the following Experimental Examples 1 to 8 are as follows.

TABLE 1
| Polymer | |
|---|---|
| A | 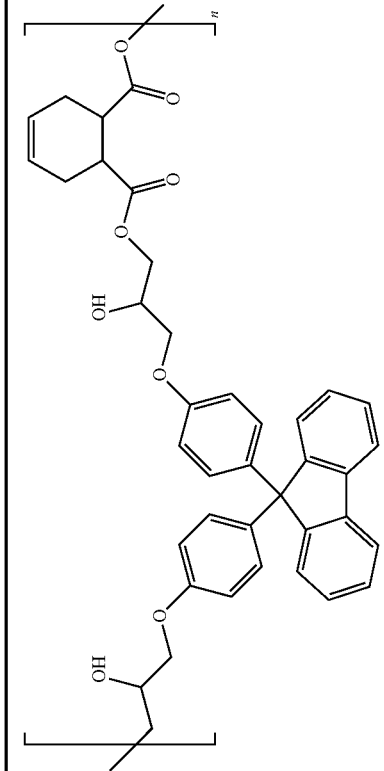 |
| B1 and B2 | 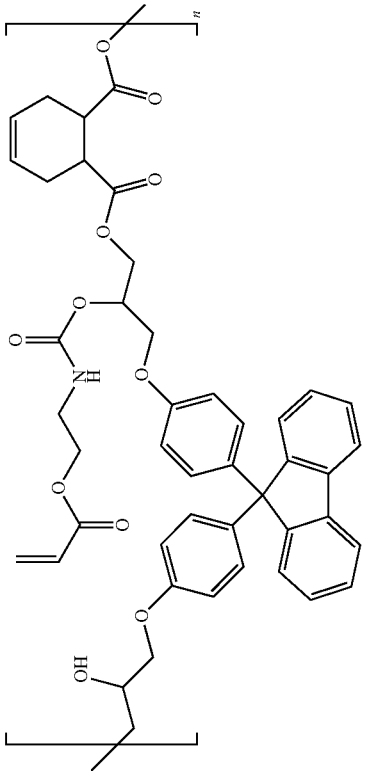 |

TABLE 1-continued
| Polymer | |
|---|---|
| C | 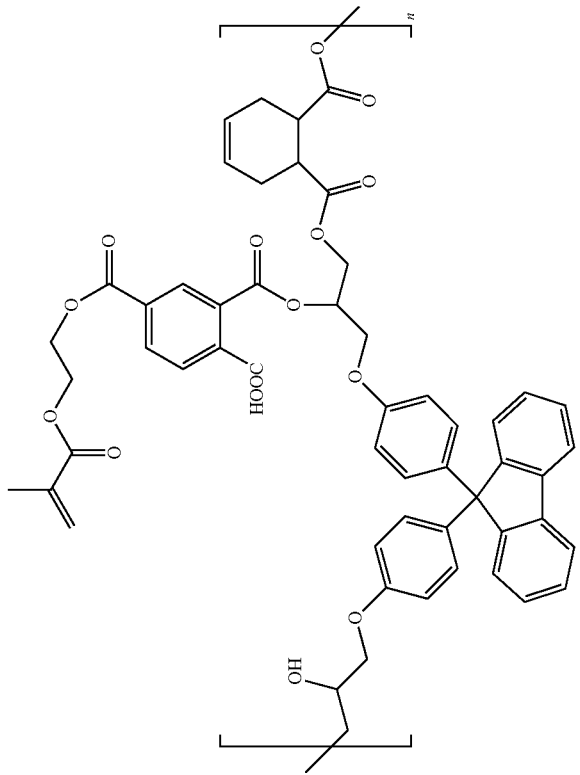 |
| D1 to D3 | 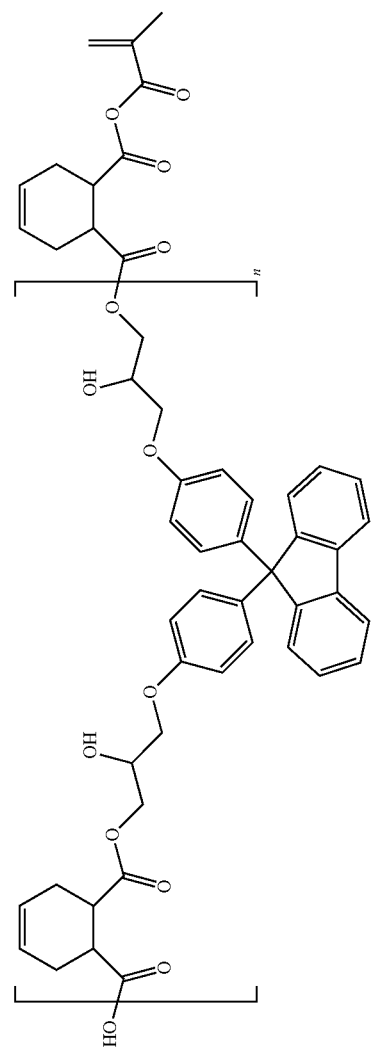 |

TABLE 1-continued
Polymer
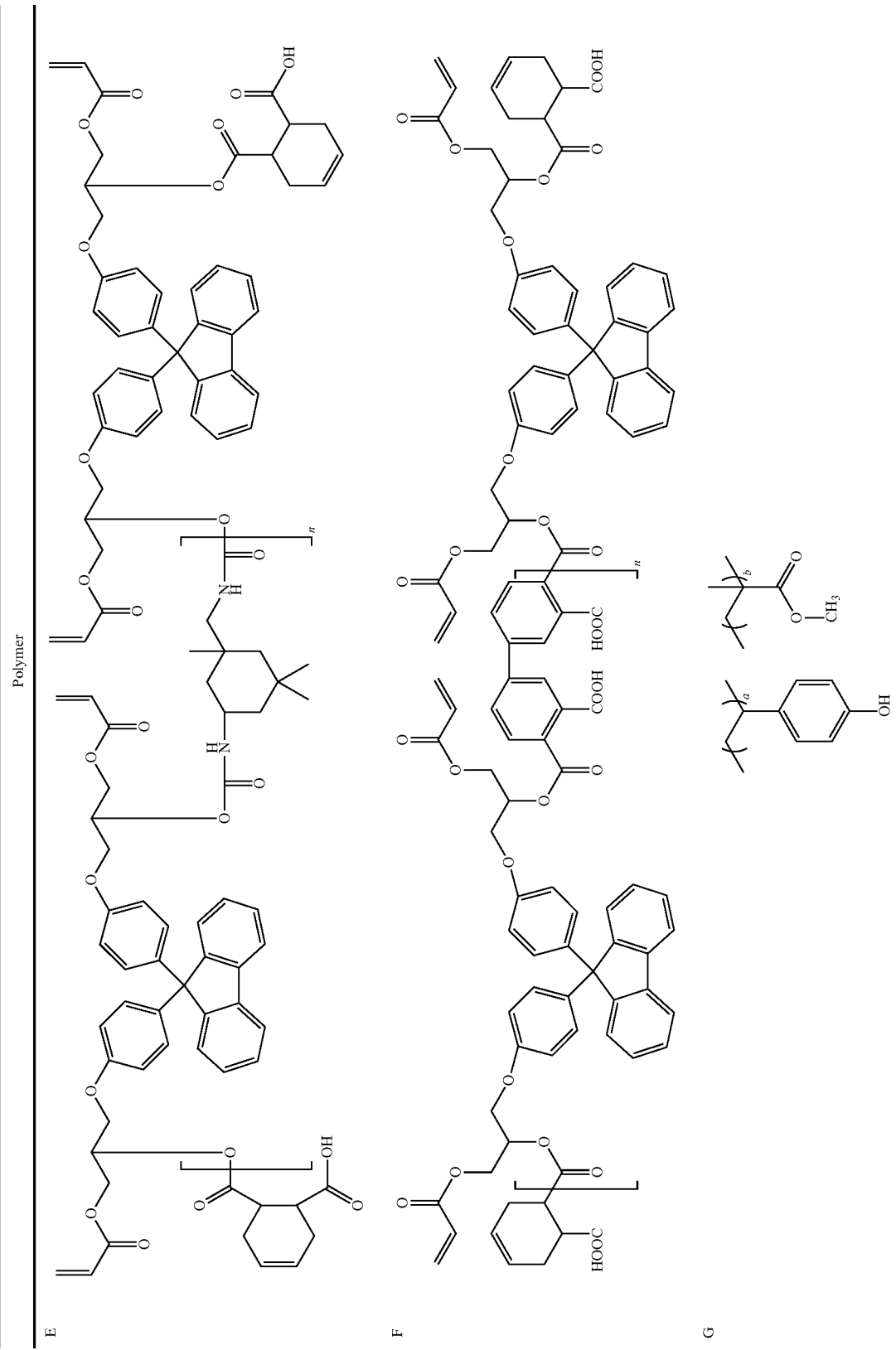

TABLE 1-continued

| Polymer |
|---|
| (chemical structure) |

<Polymer A>

112 g of 9,9-bisphenolfluorene diglycidyl ether and 63 g of phthalic acid were stirred together with 325 g of propylene glycol methyl ether acetate. The reactor was heated to 120° C. while flowing nitrogen into the reactor. The reaction was terminated after 24 hours and Polymer A was obtained. (Mw=2,710 g/mol, 86 KOH mg/g)

<Polymer B1>

To 150 g of Polymer A, 4 g of 2-acryloyloxy ethyl isocyanate and 9 g of propylene glycol methyl ether acetate were introduced, and the result was heated to 80° C. After 19 hours, the reaction was terminated, and Polymer B1 having double bonds was obtained. (B1: Mw=2,840 g/mol, 81 KOH mg/g)

<Polymer B2>

To 150 g of Polymer A, 8 g of 2-acryloyloxy ethyl isocyanate and 9 g of propylene glycol methyl ether acetate were introduced, and the result was heated to 80° C. After 19 hours, the reaction was terminated, and Polymer B2 having double bonds was obtained. (B2: Mw=3,100 g/mol, 75 KOH mg/g)

<Polymer C>

To 150 g of Polymer A, 9 g of 4-methacryloxyethyl trimellitic anhydride (4-META) and 17 g of propylene glycol methyl ether acetate were introduced, and the result was heated to 80° C. After 19 hours, the reaction was terminated, and Polymer C having double bonds was obtained. (Mw=3,150 g/mol, 93 KOH mg/g)

<Polymer D1>

To 150 g of Polymer A, 8 g of glycidyl methyl methacrylate and 17 g of propylene glycol methyl ether acetate were introduced, and the result was heated to 80° C. After 19 hours, the reaction was terminated, and Polymer D1 having double bonds was obtained. (D1: Mw=2,760 g/mol)

<Polymer D2>

To 150 g of Polymer A, 16 g of glycidyl methyl methacrylate and 17 g of propylene glycol methyl ether acetate were introduced, and the result was heated to 80° C. After 19 hours, the reaction was terminated, and Polymer D2 having double bonds was obtained. (D2: Mw=2,840 g/mol, 67 KOH mg/g)

<Polymer D3>

To 150 g of Polymer A, 40 g of glycidyl methyl methacrylate and 17 g of propylene glycol methyl ether acetate were introduced, and the result was heated to 80° C. After 19 hours, the reaction was terminated, and Polymer D3 having double bonds was obtained. (D3: Mw=2,890 g/mol, 44 KOH mg/g)

<Polymer E>

202 g of (9H-fluorene-9,9-diyl)bis(4,1-phenylenebis(oxy)bis(2-hydroxypropane-3,1-diyl))diacrylate and 19 g of isophoronediisocyanate 3-isocyanatomethyl-3,5,5-trimethylcyclohexyl isocyanate (Evonik Industries) were introduced to 180 g of PGMEA, and the result was stirred for 12 hours at 80° C. 22.5 g of tetrahydrophthalic anhydride was introduced thereto, and the result was further stirred for 12 hours to synthesize Polymer E. (Mw=3,500 g/mol, 30 KOH mg/g)

<Polymer F>

200 g of (9H-fluorene-9,9-diyl)bis(4,1-phenylenebis(oxy)bis(2-hydroxypropane-3,1-diyl))diacrylate and 16 g of 3,3,4,4-biphenyltetracarboxyl anhydride were introduced to 180 g of PGMRA, and the result was stirred for 15 hours at 80° C. 30 g of tetrahydrophthalic anhydride was introduced thereto, and the result was further stirred for 12 hours to synthesize Polymer F. (Mw=3,700 g/mol, 100 KOH mg/g>

<Polymer G>

100 g of poly(4-vinylphenol-co-methyl methacrylate) of Aldrich (Cat No. 474576, monomer ratio (mol %) 4-vinylphenol:methyl methacrylate=75:25) was dissolved in 900 g of PGMEA to synthesize solid 10% Polymer G. (Mw=11,000 g/mol)

<Polymer H>

2,2'-Bis-3-amino-4-hydroxyphenyl-hexafluoropropane (320 g) and 3,3',4,4'-oxydiphthalic anhydride (212 g) were introduced to PGMEA (1180 g), and the result was stirred at 80° C. Gamma-valerolactam (16 g), trimeric anhydride (74 g) and triethylamine (58 g) were introduced thereto, and the result was stirred for 12 hours at 175° C. To this precursor, 2-acryloyloxyethyl isocyanate (19 g) was introduced, and the result was stirred for 19 hours at 80° C. to obtain Polymer H. (Mw=5,200 g/mol, degree of imidization=92%)

Experimental Example 1

400 g of lactam black (BK-5108, Tokushiki Co., Ltd., content 16%), 120 g of Polymer G (Aldrich, Mw=25,000), 60 g of Polymer E, 10 g of Polymer F and 80 g of Polymer B1 as an alkali-soluble acrylic binder, 36 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 43 g of propylene glycol monomethyl ether acetate and 240 g of 3-methoxybutyl acetate as a solvent were mixed.

Next, the mixture was stirred for 5 hours to prepare a photosensitive resin composition.

Experimental Example 2

400 g of lactam black (BK-5108, Tokushiki Co., Ltd., content 16%), 120 g of Polymer G (Aldrich, Mw=25,000), 60 g of Polymer B1 and 88 g of Polymer H as an alkali-soluble acrylic binder, 38 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 43 g of propylene glycol monomethyl ether acetate and 240 g of 3-methoxybutyl acetate as a solvent were mixed.

Next, the mixture was stirred for 5 hours to prepare a photosensitive resin composition.

Experimental Example 3

400 g of lactam black (BK-5108, Tokushiki Co., Ltd., content 16%), 120 g of Polymer G (Aldrich, Mw=25,000), 60 g of Polymer E, 10 g of Polymer F and 80 g of Polymer A as an alkali-soluble acrylic binder, 36 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 43 g of propylene glycol monomethyl ether acetate and 240 g of 3-methoxybutyl acetate as a solvent were mixed.

Next, the mixture was stirred for 5 hours to prepare a photosensitive resin composition.

Experimental Example 4

400 g of lactam black (BK-5108, Tokushiki Co., Ltd., content 16%), 120 g of Polymer G (Aldrich, Mw=25,000), 60 g of Polymer E, 10 g of Polymer F and 80 g of Polymer B2 as an alkali-soluble acrylic binder, 36 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 43 g of propylene glycol monomethyl ether acetate and 240 g of 3-methoxybutyl acetate as a solvent were mixed.

Next, the mixture was stirred for 5 hours to prepare a photosensitive resin composition.

Experimental Example 5

400 g of lactam black (BK-5108, Tokushiki Co., Ltd., content 16%), 120 g of Polymer G (Aldrich, Mw=25,000), 60 g of Polymer E, 10 g of Polymer F and 80 g of Polymer C as an alkali-soluble acrylic binder, 36 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 43 g of propylene glycol monomethyl ether acetate and 240 g of 3-methoxybutyl acetate as a solvent were mixed.

Next, the mixture was stirred for 5 hours to prepare a photosensitive resin composition.

Experimental Example 6

400 g of lactam black (BK-5108, Tokushiki Co., Ltd., content 16%), 120 g of Polymer G (Aldrich, Mw=25,000), 78 g of Polymer D1 and 80 g of Polymer H as an alkali-soluble acrylic binder, 38 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 33 g of propylene glycol monomethyl ether acetate and 240 g of 3-methoxybutyl acetate as a solvent were mixed.

Next, the mixture was stirred for 5 hours to prepare a photosensitive resin composition.

Experimental Example 7

400 g of lactam black (BK-5108, Tokushiki Co., Ltd., content 16%), 120 g of Polymer G (Aldrich, Mw=25,000), 78 g of Polymer D2 and 80 g of Polymer H as an alkali-soluble acrylic binder, 38 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 33 g of propylene glycol monomethyl ether acetate and 240 g of 3-methoxybutyl acetate as a solvent were mixed.

Next, the mixture was stirred for 5 hours to prepare a photosensitive resin composition.

Experimental Example 8

400 g of lactam black (BK-5108, Tokushiki Co., Ltd., content 16%), 120 g of Polymer G (Aldrich, Mw=25,000), 78 g of Polymer D3 and 80 g of Polymer H as an alkali-soluble acrylic binder, 38 g of dipentaerythritol hexaacrylate as a multifunctional monomer, 4 g of OXE-02 (BASF Corporation) as a photopolymerization initiator, 5 g of 3-methacryloxypropyltrimethoxysilane as an adhesion promoter, 2 g of BYK-307 (ALTANA) as a leveling agent, and 33 g of propylene glycol monomethyl ether acetate and 240 g of 3-methoxybutyl acetate as a solvent were mixed.

Next, the mixture was stirred for 5 hours to prepare a photosensitive resin composition.

Each of the photosensitive resin composition solutions prepared in Experimental Examples 1 to 8 was spin coated on an ITO thin film-deposited glass substrate, the solvent was removed by vacuum drying (VCD) up to 40 Pa, and the substrate was heat treated for 2 minutes at approximately 100° C. to form a film. In order to examine development adhesion, the substrate was exposed with energy of 80 mJ/cm$^2$ under a high pressure mercury lamp using a photomask. The exposed substrate was developed in a puddle manner at a temperature of 22° C. in an aqueous 2.38% tetramethylammonium hydroxide (TMAH) solution, and then washed with pure water for 20 seconds in a spin & spray manner, dried, and post-baked for 30 minutes in a 230° C. convection oven to prepare a substrate having a thickness of 2.5 μm and optical density of 3.75, and the following Evaluation Examples 1 to 4 were performed.

Development time: time of puddle development using aqueous 2.38% TMAH solution.

Hole: part anode washed off by a developer as non-exposed area

Straightness: degree of straightness on both side surface parts in which holes are produced Taper: after forming hole, angle of section formed by coated surface and the hole 10 μm: size of hole pattern obtained after development with 10 μm sized mask non-exposed portion 15 μm: size of hole pattern obtained after development with 15 μm sized mask non-exposed portion Evaluation Example 1

Evaluation of Straightness

In the film obtained after the post-bake, an active area (anode) hole pattern was formed in a non-exposed area to a film thickness of approximately 2.5 μm. In the hole pattern formation, straightness of the section forming the hole whether the hole end is formed as the mask shape was evaluated through a scanning electron microscope (SEM).

Evaluation Example 2

Evaluation of Development Margin

The rate of CD changes of the hole pattern was evaluated with the development at a 10 second interval.

Figures 1, 2:
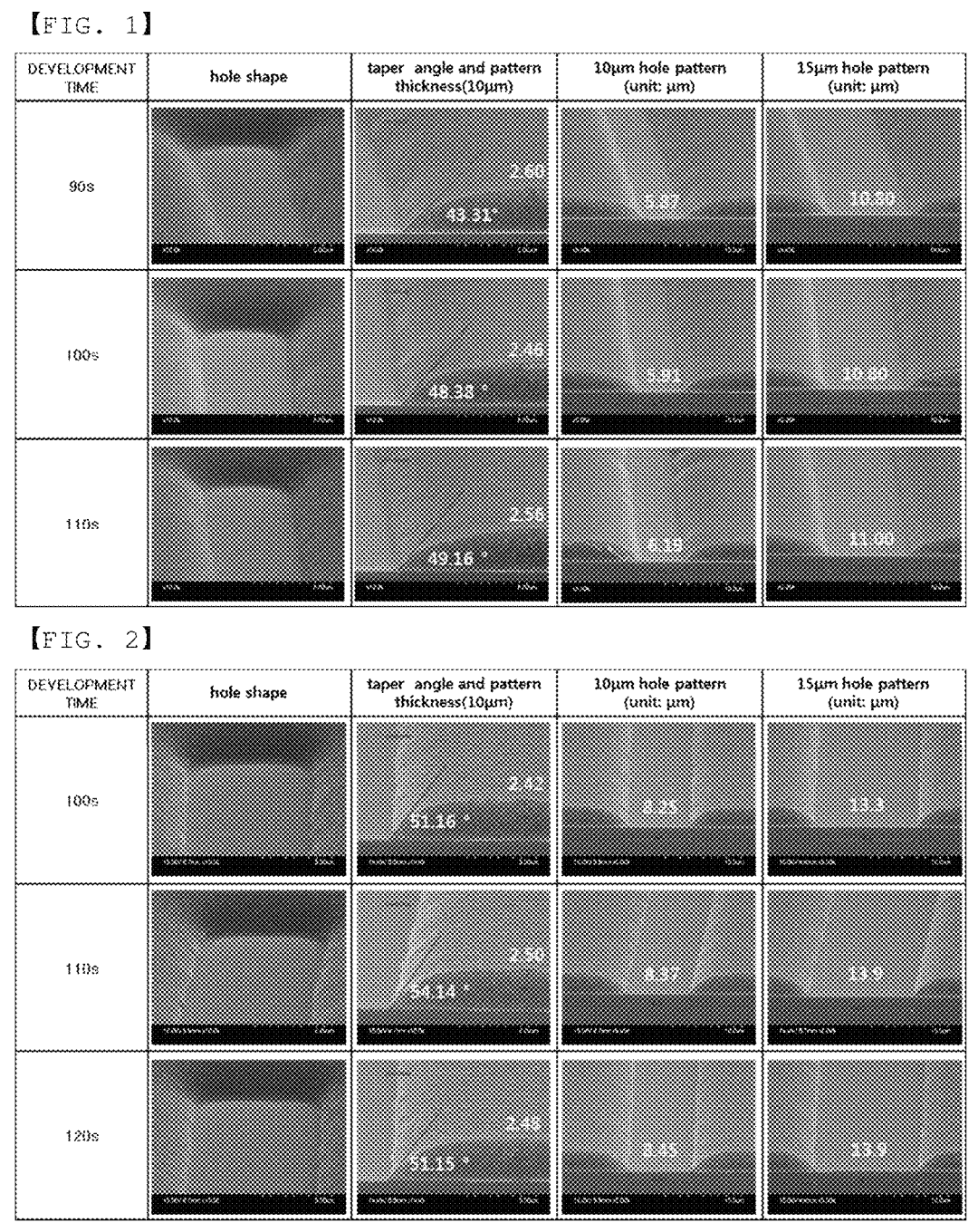

FIGS. 1 to 5 show results of evaluating straightness and development margin of Experimental Examples 1 to 5.

FIG. 1 shows evaluation results after development with Experimental Example 1, and it was seen that holes were formed at a taper angle of 50° or less. In addition, it was seen that excellent development margin was obtained with changes in the hole sizes being approximately 0.16 μm as the development time increased by 10 seconds in the 10 μm hole.

FIG. 2 shows evaluation results after development with Experimental Example 2, and it was seen that holes were formed at a taper angle of 50° or less. In addition, absolute sizes of the holes were larger compared to Experimental Example 1, however, it may be resolved by sensitivity adjustment, and it was seen that changes in the hole sizes were approximately 0.16 µm as the development time increased by 10 seconds in the 10 µm hole.

FIG. 3 shows evaluation results after development with Experimental Example 3, and it was seen that straightness was not favorable in the development 110s compared to Experimental Example 1. In addition, changes in the hole sizes were approximately 0.40 µm as the development time increased by 10 seconds in the 10 µm hole pattern, which was larger compared to Experimental Examples 1 and 2.

FIG. 4 shows evaluation results after development with Experimental Example 4, and it was seen that hole pattern and straightness were not favorable. In addition, changes in the hole sizes were approximately 0.26 µm as the development time increased by 10 seconds in the 10 µm hole, which was larger compared to Experimental Examples 1 and 2.

FIG. 5 shows evaluation results after development with Experimental Example 5, and while Experimental Example 1 comprises B1 in which A2 of Chemical Formula 1 of the present specification is a carbamate group, a substituent is linked with an ester group in Polymer C of Experimental Example 5. In this case, it was seen that, although straightness was favorable, changes in the hole sizes were approximately 1.99 µm as the development time increased by 10 seconds in the 10 µm hole, which was larger compared to Experimental Example 1, and therefore, development margin was insufficient.

Evaluation Example 3

Evaluation of Residues

In the film obtained after the post-bake, a hole pattern that is an active area was formed in a non-exposed area to a film thickness of approximately 2.5 µm. Whether the photosensitive resin composition remained in the hole pattern was evaluated through an optical microscope.

FIG. 6 shows evaluation of residues of Experimental Examples 1 to 5.

In FIG. 6, while there were no residues inside the holes and favorable straightness was visually identified in Experimental Examples 1 and 2, residues were observed although there was straightness in Experimental Examples 3 and 5, and it was identified that straightness was not favorable although there were no residues in Experimental Example 4.

Evaluation Example 4

Evaluation of Torn Out

Immediately after the development, torn out of the whole glass was visually identified.

FIG. 7 shows results of evaluating torn out of Experimental Example 6. It was seen that Experimental Examples 6 to 8 had decreased compatibility for a tetramethylammonium hydroxide (TMAH) developer and had a torn out form, and evaluations of straightness and processability of residue identification were not able to be performed.

Evaluation results of Evaluation Examples 1 to 4 are shown in the following Table 2.

TABLE 2

| | Straightness | Residues | Development Margin | Torn out |
|---|---|---|---|---|
| Experimental Example 1 | ○ | ○ | ○ | ○ |
| Experimental Example 2 | ○ | ○ | ○ | ○ |
| Experimental Example 3 | Δ | X | X | ○ |
| Experimental Example 4 | X | ○ | ○ | ○ |
| Experimental Example 5 | ○ | X | X | ○ |
| Experimental Example 6 | — | — | — | X |
| Experimental Example 7 | — | — | — | X |
| Experimental Example 8 | — | — | — | X |

○: Favorable,
Δ: Fair,
X: Poor

As shown in Table 2, it was seen that Experimental Examples 1 and 2, the photosensitive resin composition for a black bank comprising a polymer resin compound having a repeating unit of Chemical Formula 1 of the present specification, had excellent straightness compared to existing Experimental Examples 3 and 4.

In addition, the hole pattern that is an active area formed in the non-exposed area of the film obtained after the post-bake has an ITO thin film and is used as an anode, and when a photosensitive resin remains as residues in the hole pattern, it becomes a cause for poor pixels, luminance degradation and device lifetime decrease. It was seen that Experimental Examples 1 and 2 had no residue remaining compared to existing Experimental Example 3, which was excellent in the effects of preventing poor pixels, luminance degradation and device lifetime decrease.

In addition, when developing in a puddle manner using an aqueous tetramethylammonium hydroxide (TMAH) solution, a time difference occurs for bringing a photosensitive resin composition coated on a glass substrate into contact with a developer, and a stable development margin is required. In Experimental Examples 1 and 2, the rate of CD changes per 10 seconds was just 0.16 µm, and the development margin was stable compared to Experimental Examples 3 to 5, and it was seen that an excellent effect in the tetramethylammonium hydroxide (TMAH) development resistance was obtained.

In addition, a photosensitive resin composition may have peel off in the form of torn out when developing depending on the development ability of the composition, and in this case, a proper pattern is difficult to obtain. Accordingly, adhesive strength for an ITO thin-film deposited substrate needs to be favorable, and development resistance for a tetramethylammonium hydroxide (TMAH) developer needs to be present. It was identified that a pattern was favorably obtained without a torn out phenomenon in Experimental Examples 1 and 2 than in Experimental Examples 6 to 8.

By comprising a polymer resin compound represented by Chemical Formula 1, a photosensitive resin composition for a black bank according to one embodiment of the present specification is effective in reducing external light reflection by having a light-shielding property, and improving luminance degradation when using a black bank comprising the photosensitive resin composition for a black bank in an insulating film of an OLED.

In addition, by comprising a polymer resin compound represented by Chemical Formula 1, the photosensitive resin composition is capable of enhancing a device lifetime of a black bank for mobiles and visibility as well as improving hole residues and straightness when obtaining a hole pattern using a narrow slit for enhancing performance of the black bank for mobiles.

Hereinbefore, preferred embodiments of the present specification have been described, however, the present disclosure is not limited thereto, and various modifications may be made within the scope of the claims and the scope of the detailed descriptions, and these also belong to the scope of the present disclosure.

What is claimed is:

1. A polymer resin compound comprising a repeating unit of the following Chemical Formula 1:

[Chemical Formula 1]

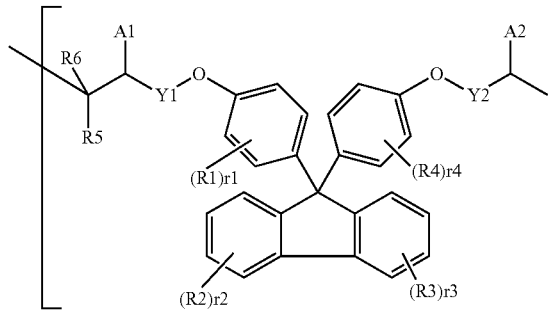

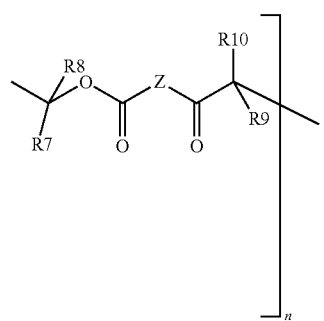

wherein,

A1 and A2 are the same as or different from each other, and each independently a substituted or unsubstituted carbamate group; or a hydroxyl group;

when any one of A1 and A2 is a hydroxyl group, the other is a substituted or unsubstituted carbamate group;

Y1 and Y2 are the same as or different from each other, and each independently a substituted or unsubstituted alkylene group having 1 to 3 carbon atoms; a substituted or unsubstituted ethylene oxide group; or a substituted or unsubstituted propylene oxide group;

Z is a substituted or unsubstituted divalent alkyl group; substituted or unsubstituted divalent cyclohexane; substituted or unsubstituted divalent cyclohexyne; or substituted or unsubstituted divalent benzene;

R1 to R10 are the same as or different from each other, and each independently hydrogen; deuterium; a halogen group; a substituted or unsubstituted alkyl group having 1 to 10 carbon atoms; a substituted or unsubstituted cycloalkyl group having 3 to 10 carbon atoms; a substituted or unsubstituted silyl group; a substituted or unsubstituted phosphine oxide group; a substituted or unsubstituted aryl group; or a substituted or unsubstituted heterocyclic group;

r1 to r4 are each independently an integer of 1 to 4;

when r1 to r4 are each 2 or greater, structures in the parentheses are each the same as or different from each other;

n is from 2 to 5,000; and when n is 2 or greater, structures in the parentheses are the same as or different from each other.

2. The polymer resin compound of claim 1, wherein the carbamate group is represented by the following Chemical Formula 2:

[Chemical Formula 2]

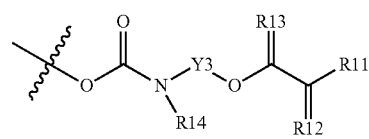

wherein,

Y3 is a substituted or unsubstituted alkylene group having 1 to 3 carbon atoms; a substituted or unsubstituted ethylene oxide group; or a substituted or unsubstituted propylene oxide group;

R11 and R14 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group, R12 and R13 are the same as or different from each other, and each independently O; S; NR101; or CR102R103; and R101 to R103 are hydrogen; deuterium; a substituted or unsubstituted alkyl group; a substituted or unsubstituted cycloalkyl group; a substituted or unsubstituted aryl group; or a substituted or unsubstituted heterocyclic group.

3. The polymer resin compound of claim 1, wherein Chemical Formula 1 is represented by the following Chemical Formula 3:

[Chemical Formula 3]
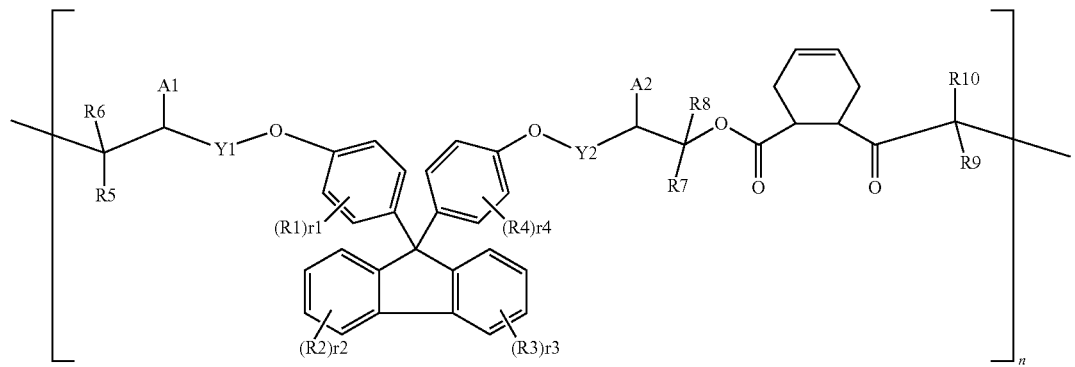
wherein,
A1, A2, Y1, Y2, R1 to R10, r1 to r4 and n are as defined in claim 1.
4. The polymer resin compound of claim 1, wherein Chemical Formula 1 is represented by any one of the following Chemical Formulae 4 to 6:
[Chemical Formula 4]
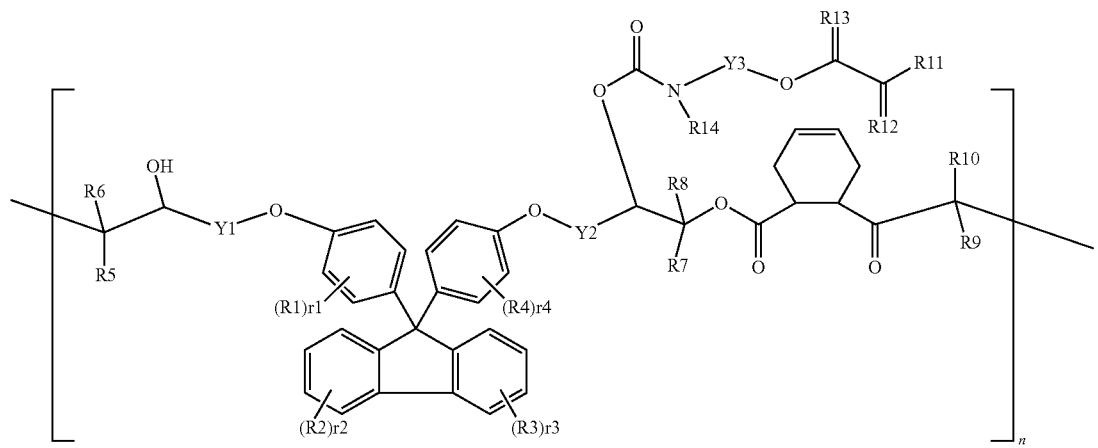
[Chemical Formula 5]
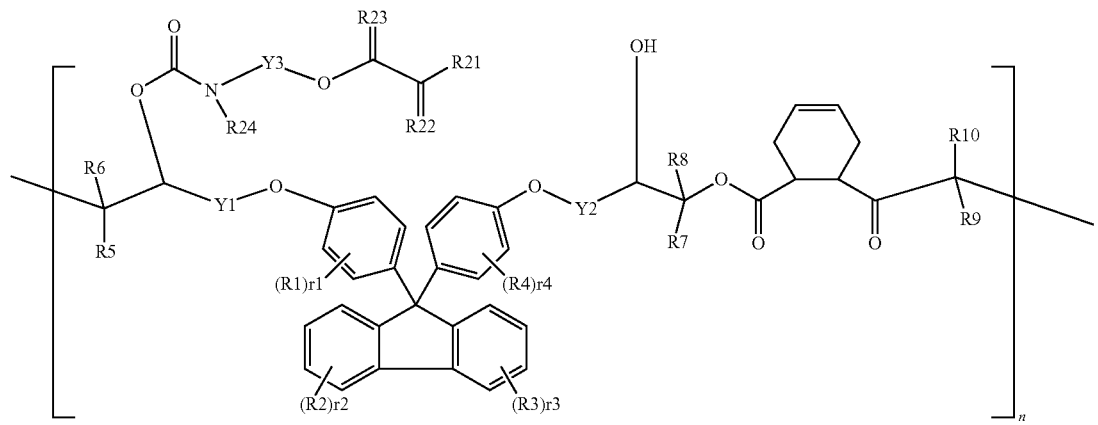

-continued

[Chemical Formula 6]

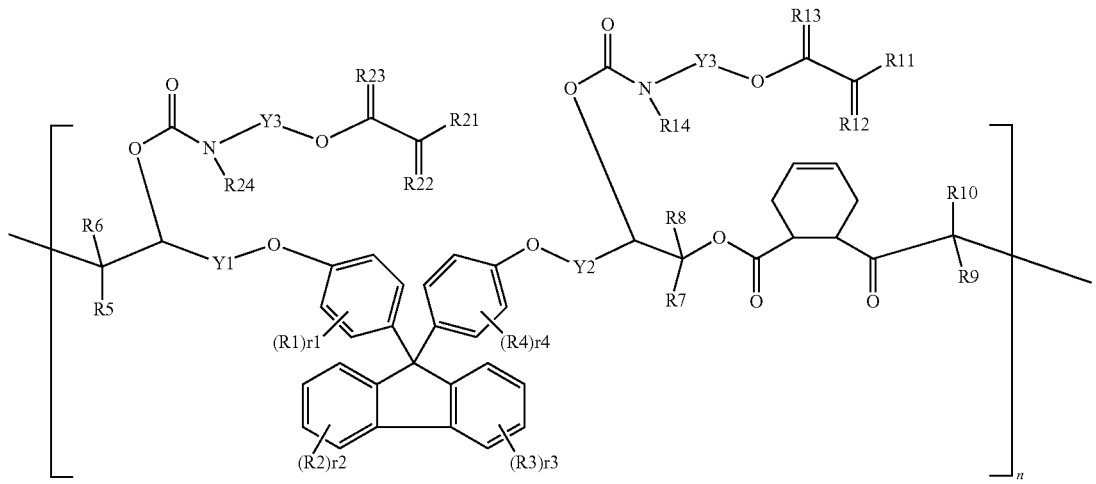

wherein,

Y1, Y2, R1 to R10, r1 to r4 and n are as defined in claim 1;

Y3 is a substituted or unsubstituted alkylene group having 1 to 3 carbon atoms; a substituted or unsubstituted ethylene oxide group; or a substituted or unsubstituted propylene oxide group;

R11, R14, R21 and R24 are the same as or different from each other, and each independently hydrogen; deuterium; a halogen group; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heterocyclic group;

R12, R13, R22 and R23 are the same as or different from each other, and each independently O; S; NR101; or CR102R103; and R101 to R103 are the same as or different from each other, and each independently hydrogen; deuterium; a substituted or unsubstituted alkyl group; a substituted or unsubstituted cycloalkyl group; a substituted or unsubstituted aryl group; or a substituted or unsubstituted heterocyclic group.

5. The polymer resin compound of claim 1, which has a weight average molecular weight of 1,000 to 50,000.

6. A photosensitive resin composition for a black bank comprising:
the polymer resin compound of claim 1;
a monomer;
a photoinitiator;
a coloring agent; and
a solvent.

7. The photosensitive resin composition of claim 6, wherein a content of the polymer resin compound is from 1% by weight to 20% by weight based on a total weight of the photosensitive resin composition.

8. The photosensitive resin composition of claim 6, wherein the monomer comprises one or more monomers selected from the group of polyethylene glycol mono(meth)acrylate, polypropylene glycol mono(meth)acrylate, phenoxyethyl (meth)acrylate, polyethylene glycol (meth)acrylate, polypropylene glycol (meth)acrylate, trimethylolethane triacrylate, trimethylolpropane triacrylate, neopentyl glycol (meth)acrylate, pentaerythritol hexaacrylate and dipentaerythritol hexaacrylate (DPHA).

9. The photosensitive resin composition of claim 6, wherein a content of the monomer is from 1% by weight to 10% by weight based on a total weight of the photosensitive resin composition.

10. The photosensitive resin composition of claim 6, wherein the photoinitiator comprises one or more compounds selected from the group of acetophenone-based compounds, biimidazole-based compounds, triazine-based compounds and oxime-based compounds.

11. The photosensitive resin composition of claim 6, wherein a content of the photoinitiator is from 0.1% by weight to 5% by weight based on a total weight of the photosensitive resin composition.

12. The photosensitive resin composition of claim 6, wherein the solvent comprises one or more solvents selected from the group of propylene glycol monomethyl ether acetate, propylene glycol monomethyl ether, diethylene glycol ethyl methyl ether, diethylene glycol methyl butyl ether, triethylene glycol methyl butyl ether, methyl 3-methoxypropionate, ethyl 3-ethoxypropionate, diethylene glycol monoethyl ether acetate, 3-methoxybutyl acetate and 2-propanol.

13. The photosensitive resin composition of claim 6, wherein a content of the solvent is from 60% by weight to 90% by weight based on a total weight of the photosensitive resin composition.

14. The photosensitive resin composition of claim 6, further comprising one or more additives selected from the group of a photocrosslinking sensitizer, a curing accelerator, an adhesion promoter, an adhesive strength enhancer, a surfactant, an antioxidant, a thermal polymerization inhibitor, an ultraviolet absorber, a dispersant and a leveling agent.

15. A black bank comprising the photosensitive resin composition of claim 6.

16. A method for manufacturing a black bank comprising:
Step 1) coating the photosensitive resin composition of claim 6 on a substrate to form a photosensitive resin film;
Step 2) exposing and developing the photosensitive resin film to pattern the coated photosensitive resin film; and
Step 3) curing the patterned photosensitive resin film.

17. The method for manufacturing a black bank of claim 16, wherein a developer used for developing in the step 2) is an aqueous tetramethylammonium hydroxide (TMAH) solution.

\* \* \* \* \*